(12) United States Patent
Oh et al.

(10) Patent No.: US 10,332,994 B2
(45) Date of Patent: Jun. 25, 2019

(54) METHOD FOR MANUFACTURING THREE-DIMENSIONAL SEMICONDUCTOR INTEGRATED CIRCUIT DEVICE

(71) Applicant: SK hynix Inc., Gyeonggi-do (KR)

(72) Inventors: Dong Yean Oh, Gyeonggi-do (KR); Sang Yong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/367,368

(22) Filed: Dec. 2, 2016

(65) Prior Publication Data

US 2018/0019336 A1  Jan. 18, 2018

(30) Foreign Application Priority Data

Jul. 15, 2016 (KR) ........................ 10-2016-0089964

(51) Int. Cl.
*H01L 29/423* (2006.01)
*H01L 29/78* (2006.01)
*H01L 21/02* (2006.01)
*H01L 21/285* (2006.01)
*H01L 21/306* (2006.01)
(Continued)

(52) U.S. Cl.
CPC ...... *H01L 29/7827* (2013.01); *H01L 21/0228* (2013.01); *H01L 21/285* (2013.01); *H01L 21/30604* (2013.01); *H01L 29/0649* (2013.01); *H01L 29/4236* (2013.01); *H01L 29/42364* (2013.01); *H01L 29/66621* (2013.01); *H01L 29/66666* (2013.01); *H01L 29/78* (2013.01)

(58) Field of Classification Search
CPC ............ H01L 21/0228; H01L 29/0649; H01L 29/4236; H01L 21/823481; H01L 29/78; H01L 21/823814; H01L 21/762; H01L 27/10876; H01L 27/10823; H01L 29/7827; H01L 29/66621; H01L 29/0653; H01L 29/0847; H01L 29/42364; H01L 28/7827

See application file for complete search history.

(56) References Cited

U.S. PATENT DOCUMENTS 7,892,896 B2 * 2/2011 Shim ................. H01L 21/26506
438/138
9,184,294 B2 * 11/2015 Cea .................... H01L 29/66545
(Continued)

FOREIGN PATENT DOCUMENTS

KR    1020140028946    3/2014

OTHER PUBLICATIONS

Tabe, M., et al., Effect of Donor-level Deepening in nm-scale Si SOI-MOSFETs, Journal of Advanced Research in Physics 2(1), 2011.
(Continued)

*Primary Examiner* — Khiem D Nguyen
(74) *Attorney, Agent, or Firm* — IP & T Group LLP

(57) ABSTRACT

A semiconductor integrated circuit device may include an isolating layer, a buried gate, source and drain regions, a dielectric layer having a high dielectric constant and an insulating interlayer. The isolating layer may be formed on a semiconductor substrate to define an active region. The buried gate may be formed in the active region of the semiconductor substrate. The source and drain regions may be formed in the active region at both sides of the buried gate. The dielectric layer may be configured to surround the source and drain regions. The insulating interlayer may be formed on the dielectric layer.

7 Claims, 6 Drawing Sheets

(51) Int. Cl.
*H01L 29/06* (2006.01)
*H01L 29/66* (2006.01)

(56) References Cited

U.S. PATENT DOCUMENTS

| | | | | |
|---|---|---|---|---|
| 9,196,725 | B2* | 11/2015 | Han | H01L 29/7827 |
| 9,330,983 | B1* | 5/2016 | Cheng | H01L 21/823864 |
| 2009/0283823 | A1* | 11/2009 | Izumi | H01L 29/1095 |
| | | | | 257/332 |
| 2010/0327337 | A1* | 12/2010 | Yang | H01L 27/10876 |
| | | | | 257/311 |
| 2011/0049585 | A1* | 3/2011 | Beyer | H01L 21/0206 |
| | | | | 257/288 |
| 2011/0140183 | A1* | 6/2011 | Nagai | H01L 21/823412 |
| | | | | 257/296 |
| 2012/0119285 | A1* | 5/2012 | Yang | H01L 27/10876 |
| | | | | 257/329 |
| 2012/0319195 | A1* | 12/2012 | Jang | H01L 27/10876 |
| | | | | 257/330 |
| 2013/0248989 | A1* | 9/2013 | Lee | H01L 29/66666 |
| | | | | 257/330 |
| 2013/0320460 | A1* | 12/2013 | Baek | H01L 21/76237 |
| | | | | 257/401 |
| 2014/0021521 | A1* | 1/2014 | Lim | H01L 29/94 |
| | | | | 257/296 |
| 2014/0063934 | A1* | 3/2014 | Oh | H01L 29/945 |
| | | | | 365/182 |
| 2014/0187031 | A1* | 7/2014 | Sung | H01L 21/823828 |
| | | | | 438/589 |
| 2014/0254239 | A1* | 9/2014 | Song | H01L 27/2436 |
| | | | | 365/148 |
| 2015/0079737 | A1* | 3/2015 | Min | H01L 27/1211 |
| | | | | 438/157 |
| 2015/0129973 | A1* | 5/2015 | Ji | H01L 27/0922 |
| | | | | 257/369 |

OTHER PUBLICATIONS

Kumar et al., Effect of Ni doping on structural and dielectric properties of BaTiO3, Indian Journal of Engineering & Materials Sciences, vol. 16, Dec. 2009, pp. 390-394.

* cited by examiner

METHOD FOR MANUFACTURING THREE-DIMENSIONAL SEMICONDUCTOR INTEGRATED CIRCUIT DEVICE

CROSS-REFERENCES TO RELATED APPLICATION

The present application claims priority under 35 U.S.C. § 119(a) to Korean application number 10-2016-0089964, filed on Jul. 15, 2016, in the Korean Intellectual Property Office, which is incorporated herein by reference in its entirety.

BACKGROUND

1. Technical Field

Various embodiments relate generally to a semiconductor integrated circuit device and a method of manufacturing the same and, more particularly, to a three-dimensional semiconductor integrated circuit device, and a method of manufacturing the three-dimensional semiconductor integrated circuit device.

2. Related Art

Semiconductor integrated circuit devices may be used in various portable and non-portable electronic devices, such as, for example, a personal computer, a cellular phone, a digital camera, and the like.

Generally, consumers require smaller size and lower cost electronic devices, which in turn require semiconductor devices with a higher integration degree, a higher density, a higher capacity and lower cost.

In order to meet the above-mentioned needs, a nanometer technology may be developed to prevent a short channel effect. The nanometer technology may include, for example, a buried gate technology, a vertical channel transistor, a fin field effect transistor (FinFET) and the like.

SUMMARY

According to a first embodiment of the present invention, there is provided a semiconductor integrated circuit device. The semiconductor integrated circuit device may include an isolating layer, a buried gate, source and drain regions, a dielectric layer having a high dielectric constant and an insulating interlayer. The isolating layer may be formed on a semiconductor substrate to define an active region. The buried gate may be formed in the active region of the semiconductor substrate. The source/drain regions may be formed in the active region at both sides of the buried gate. The dielectric layer may be configured to surround the source/drain regions. The insulating interlayer may be formed on the dielectric layer.

According to another embodiment, there is provided a method of manufacturing a semiconductor integrated circuit device. In the method of manufacturing the semiconductor integrated circuit device, an isolating layer may be formed on a semiconductor substrate to define an active region. The active region may be etched to form a groove. A gate insulating layer may be formed on a surface of the groove. A buried gate may be formed in a lower region of the groove. Donors may be implanted into the active region exposed through the buried gate. A dielectric layer having a high dielectric constant may be formed on the isolating layer, the active region and the buried gate. The donors in the active region may be activated. An insulating interlayer may be formed on the dielectric layer.

According to an embodiment, there may be provided a method of manufacturing a semiconductor integrated circuit device. In the method of manufacturing the semiconductor integrated circuit device, an active region having donors may be provided. The active region may be surrounded by a dielectric layer having a high dielectric constant. The donors in the active region may be activated.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
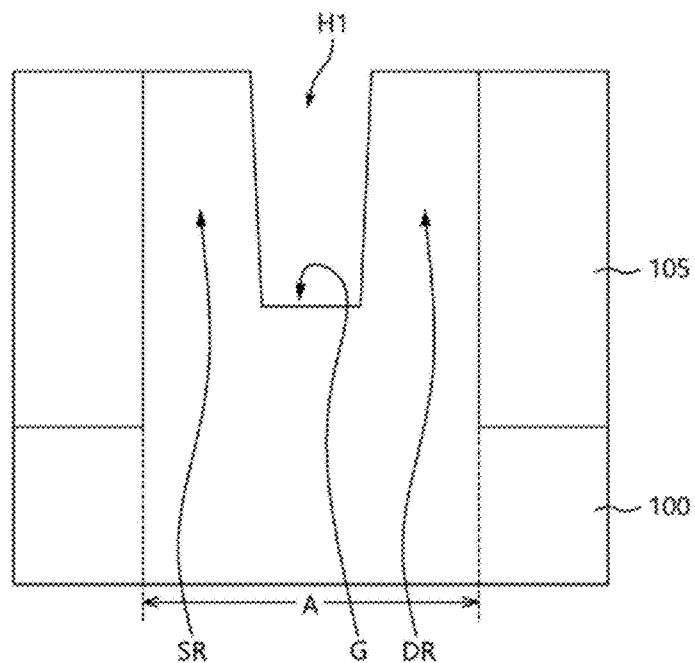
FIGS. 1 to 7 are cross-sectional views illustrating a method of manufacturing a semiconductor integrated circuit device in accordance with an embodiment.

Various example embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. The drawings are not in scale, and, the sizes and relative sizes of certain layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "includes," "including," "comprises," and/or "comprising" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

FIGS. 1 to 7 are cross-sectional views illustrating a method of manufacturing a semiconductor integrated circuit device in accordance with an embodiment.

Referring to FIG. 1, an isolating layer 105 may be formed on a semiconductor substrate 100. The isolating layer 105 may be formed, for example, by a shallow trench isolation (STI) process. The STI process may include etching a pattern of trenches in the substrate, filling the trenches with a dielectric material such as silicon dioxide and removing any excess dielectric material using chemical-mechanical planarization (CMP). The isolating layer 105 may define an active region A in which a transistor may be formed later.

The active region A of the semiconductor substrate 100 may be etched to form a groove H1. The groove H1 may have a depth less than the thickness of the isolating layer 105. The groove H1 may define regions in which a gate and source/drain regions may be formed later. For example, an inner space G of the groove H1 may correspond to the region in which a gate may be formed. Portions SR and DR of the active region at both sides of the groove H1 may correspond to regions in which the source/drain regions may be formed. Etching of the groove H1 may be performed after formation of the isolating layer 105.

Figure 2:
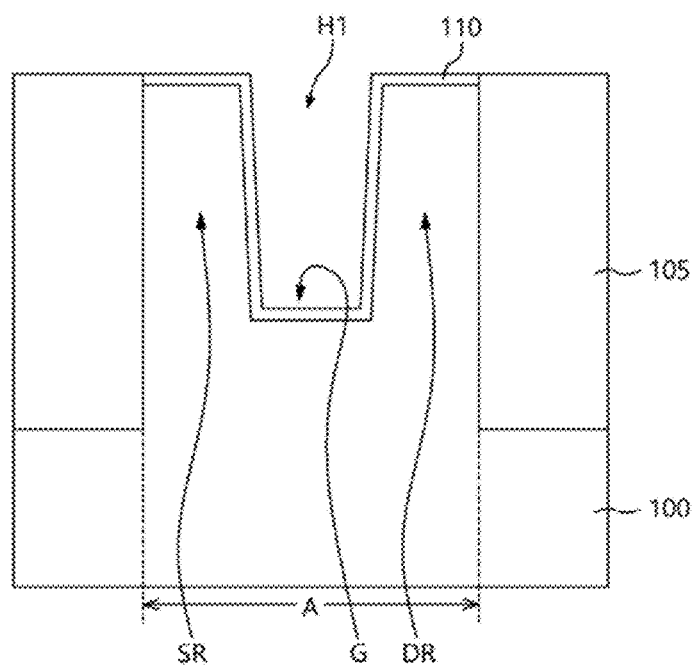

Referring to FIG. 2, a gate insulating layer 110 may be formed on an exposed surface of the active region A, i.e., an upper surface of the semiconductor substrate 100 and an inner surface of the groove H1. In some embodiments, the gate insulating layer 110 may be formed by an oxidation process. For example, the wafer may be placed inside a high-temperature furnace and exposed to a flow of oxygen to form the gate insulating layer 110. For example, when the substrate 100 is made of silicon a layer of silicon dioxide is formed on the exposed surfaces of the silicon substrate 100 to form the gate insulation layer 110.

Figure 3:
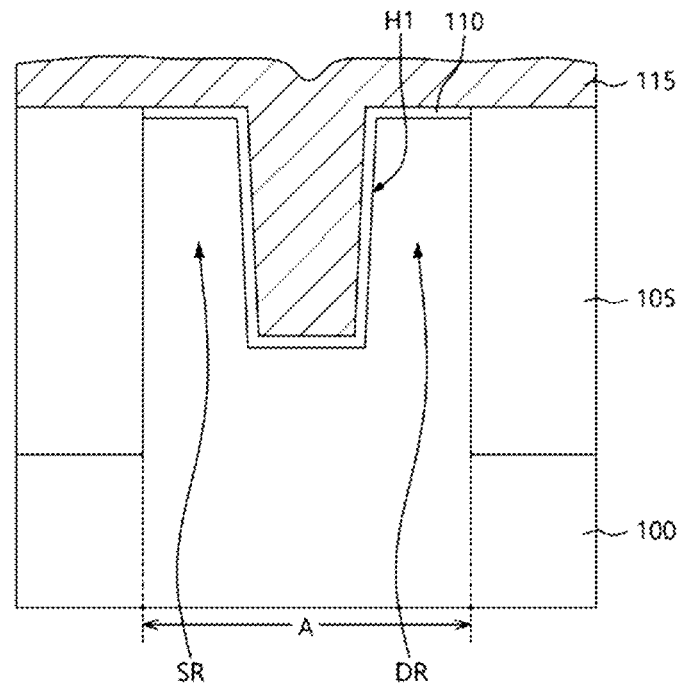

Referring to FIG. 3, a conductive layer 115 may be formed on the upper surface of the semiconductor substrate 100. In some embodiments, the conductive layer 115 may have a thickness for fully filling the groove H1.

Figure 4:
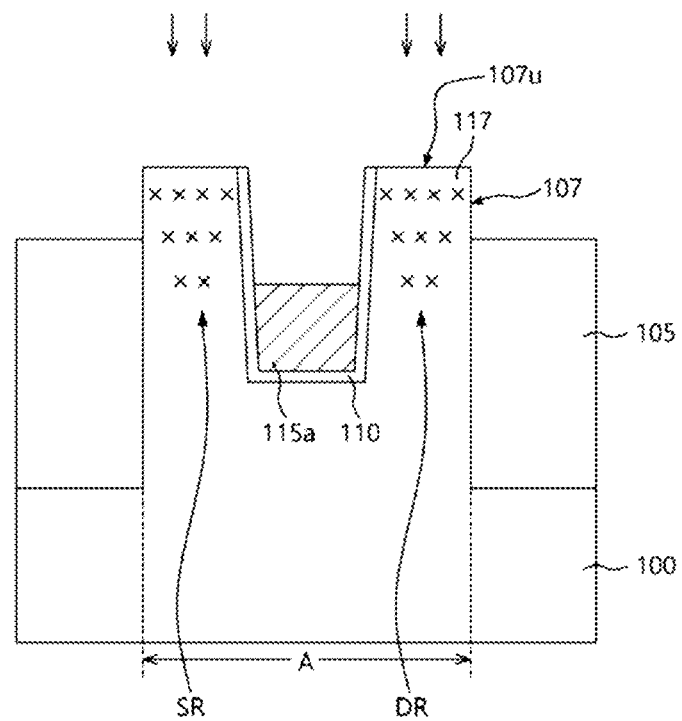

Referring to FIG. 4, the conductive layer 115 may be planarized to form a buried gate 115a in the groove H1. The conductive layer 115 may be over-etched to expose the inner surface of the groove H1 on the active region A. Thus the buried gate 115a may be positioned in a lower region of the groove H1. The gate insulating layer 110 on the inner surface of the groove H1 may be partially exposed.

Further, an upper portion of the isolating layer 105 may also be partially removed by the over-etching process to expose an upper portion 107u of the outer sidewall 107 of the active region A configured to make contact with the isolating layer 105.

Stated otherwise, an upper portion 107u of the outer sidewall 107 of the active region A may be partially exposed by the recess process of the isolating layer 105. Further, the flat part of the gate insulating layer 110 which was formed over the exposed top surface of the active region (see FIG. 2) is also removed by the over-etching process to expose the active region A.

Referring again to FIG. 4, donors 117 may be introduced into the exposed active region A, i.e., in the regions SR and DR in which the source/drain regions may be formed. The donors may be introduced via an implantation process. The donors may be activated to form source/drain regions.

Currently, as a semiconductor device may have a highly integration degree, an area of the regions in which the source/drain regions may be formed may also be greatly reduced. Particularly, when the buried gate may be applied in the semiconductor device, the region in which the source/drain regions may be formed may be defined by a pillar, a pin, a wire, etc., having several nanometers in a diameter. However, when the donors are implanted into the active region A which has a diameter of several nanometers, the donors in the narrow active region A may not be effectively activated compared to donors in large active region [See "Effect of Donor-level Deepening in nm-scale Si SOI-MOSFETs, Michiharu TABE et al., Journal of Advanced Research in Physics 2(1), 011111(2011)].

Figure 8:
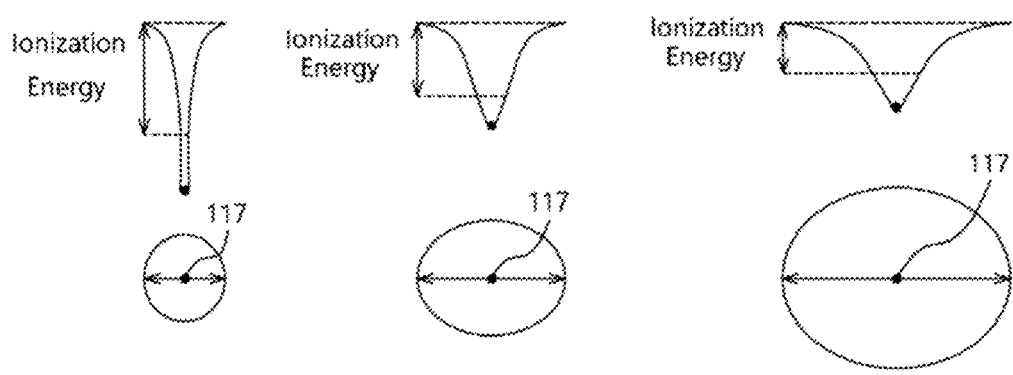
FIGS. 8 and 9 are views illustrating a process for activating donors in an active region having a nanometer of diameter.

As shown in FIG. 8, donors 117 in a narrow active region have an ionization energy higher than that of donors 117 in a large active region. Thus, it may be difficult to bounce the donors in the narrow active region to a conductive band due to the high ionization energy. As a result, the donors in the narrow active region may not be sufficiently activated compared to the donors in the large active region so that a desired concentration may not be provided to the source/drain regions. Further, the insufficient activation of the donors may increase resistances of the source/drain regions so that electrical characteristics such as write efficiency may be decreased.

Figure 9:
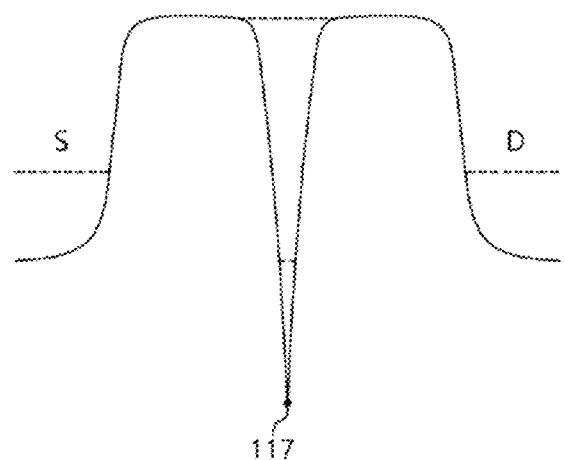

Further, as shown in FIG. 9, when a transistor having a channel with no more than about 10 nm width, it may be difficult to form the channel due to a high ionization energy gap in a channel region between source/drain regions.

The increase of the ionization energy may be caused by a mismatch between a dielectric constant of a pillar and a dielectric constant of an insulating layer configured to surround the pillar, from following for equations 1 and 2.

$$\text{Increasing of ionization energy} \propto (\varepsilon_{si} - \varepsilon_d) \quad (1)$$

$$\text{Ionization energy} \propto (1/\varepsilon_{si}^2) \quad (2)$$

The mismatch of the dielectric constants may result in decreasing an effective dielectric constant of the pillar by the dielectric constant of the insulating layer configured to surround the small pillar.

Figure 5:
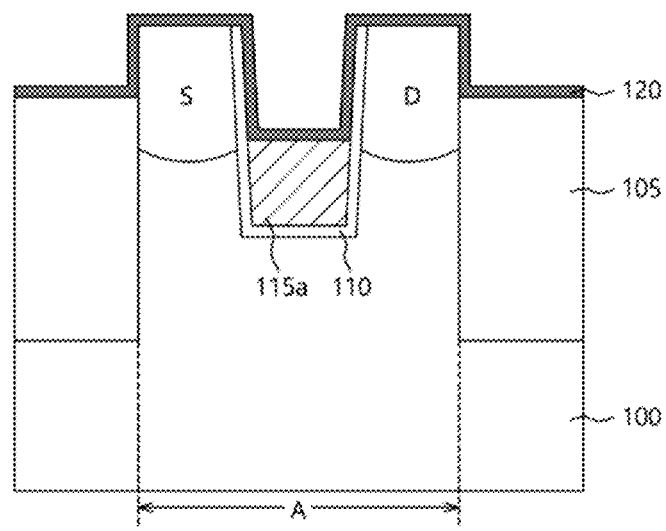

In an embodiment, in order to sufficiently activate the donors in the narrow active regions S and D of the active region A, as shown in FIG. 5, a dielectric layer 120 having a high dielectric constant may be formed over the structure previously formed according to FIG. 4. Particularly, the dielectric layer 120 may be formed on the exposed top surface of the S and D regions of the active region A, the exposed surface of the gate insulating layer 110 the exposed top surface of the buried gate region 115a and the top surface of the isolating layer 105. The dielectric layer 120 may be configured to surround the active region A having a pillar shape. The dielectric layer 120 may include a material having a dielectric constant of no less than about 12. The dielectric constant of the dielectric layer 120 may be about 12, i.e., similar to that of silicon in the source/drain regions. In some embodiments, the dielectric layer 120 may include a metal oxide layer such as an aluminum oxide layer ($Al_2O_3$), a hafnium oxide layer (HfO) or a metal layer. The dielectric layer 120 may have a sufficiently thin thickness for effectively preventing formation of a parasitic capacitance. The dielectric layer 120 may have a thickness which is substantially similar to that of the gate insulating layer 110. The dielectric layer 120 may be formed by an atomic layer deposition (ALD) process.

Figure 6:
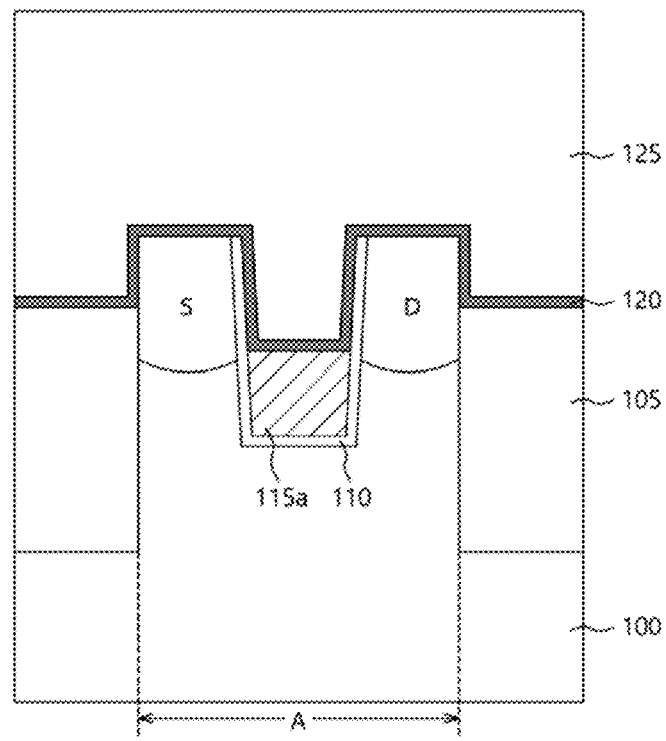

Referring to FIG. 6, an insulating interlayer 125 may be formed on the dielectric layer 120. The insulating interlayer 125 may have a dielectric constant of from about 0.1 to about 5 for preventing formation of a parasitic capacitance between wirings. When the insulating layer 125 is not used, a parasitic capacitance between wirings may be greatly increased. Thus, according to an embodiment of the present invention, the insulating interlayer 125 having a lower dielectric constant than the dielectric layer 120 may be formed between the wirings. The insulating interlayer 125 may be or include, for example, a silicon oxide layer.

Figure 7:
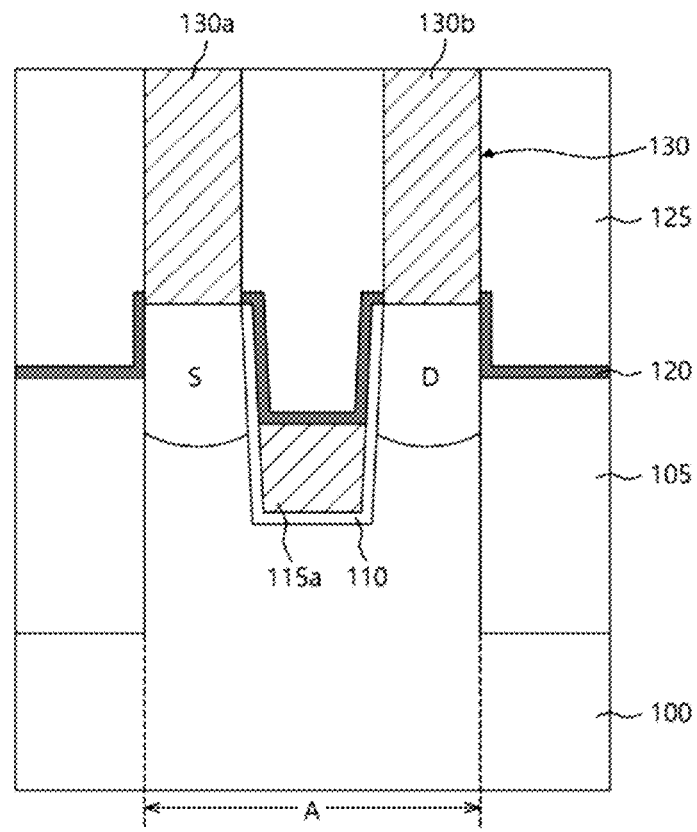

Referring to FIG. 7, the insulating interlayer 125 and the dielectric layer 120 may be etched to form contact holes 130 configured to expose the source and drain regions S and D. The contact holes may be filled with a conductive layer. The conductive layer may include a polysilicon layer doped with impurities. The conductive layer may be planarized until an upper surface of the insulating interlayer 125 may be exposed to form a first plug 130a and a second plug 130b. The first plug 130a may correspond to a storage node contact plug configured to make contact with the source region S. The second plug 130b may correspond to a bit line contact plug configured to make contact with the drain region D. Although not depicted in drawings, a storage node contact may be connected to the first plug 130a. A bit line may be connected to the second plug 130b.

Figure 10:
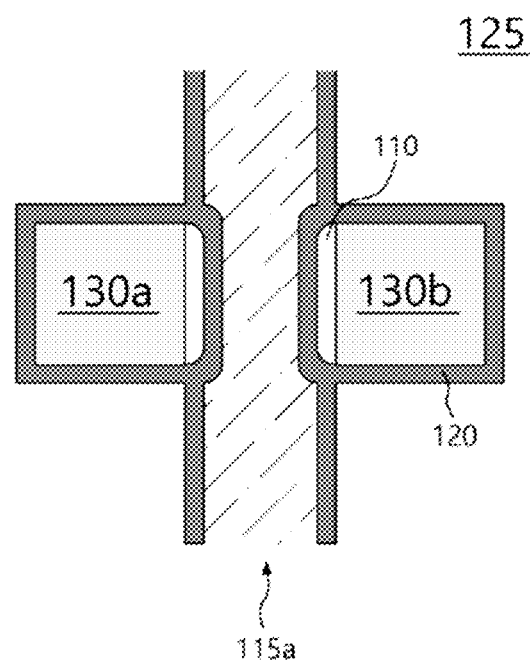
FIG. 10 is a plan view illustrating a semiconductor integrated circuit device in accordance with an embodiment.

According to an embodiment, the transistor in FIG. 10 may include the dielectric layer 120, which surrounds the active region A which includes the donors implanted therein and having a diameter of only several nanometers.

Therefore, a dielectric constant difference between the insulating regions adjacent to the active region may be remarkably reduced so that the ionization energy of the donors in the narrow active region may be decreased. As a result, the source/drain regions may have desired resistance to improve the write efficiency.

In FIG. 10, a gate region 115a is shown. However, the gate region 115a may be covered with the insulating interlayer 125.

Figure 11:
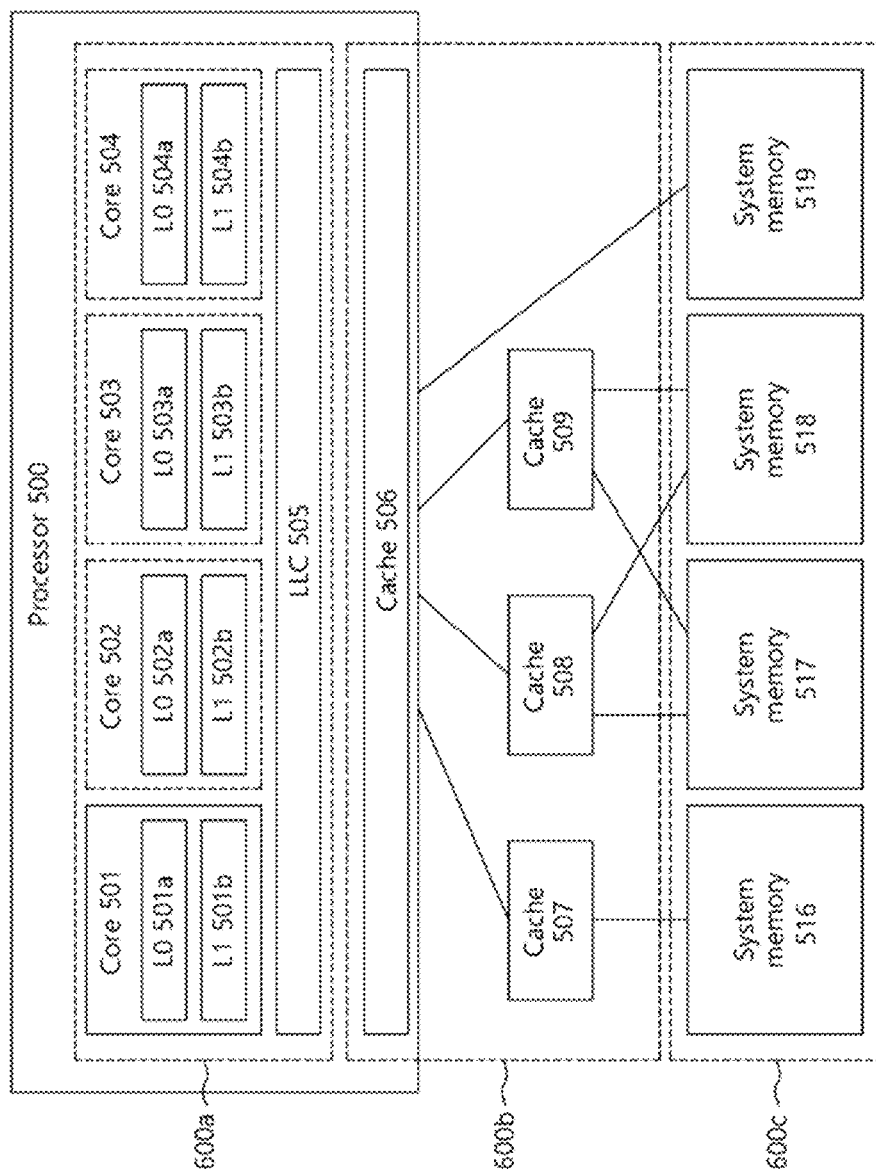
FIG. 11 is a block diagram illustrating a computer system in accordance with an embodiment.

FIG. 11 is a block diagram illustrating a computer system in accordance with example embodiments.

Referring to FIG. 11, a computer system of this example embodiment may include a processor 500, a cache memory 507 to 509 and a plurality of system memories 516 to 519.

The processor 500 may include a plurality of cores 501 to 504. Each of the cores 501 to 504 may include upper level of caches L0 501a to 504a and a middle level of caches L1 501b to 504b. The upper level of the caches L0 501a to 504a and the middle level of the caches L1 501b to 504b may be dedicated to the corresponding cores 501 to 504, respectively.

The processor 500 may include lower level of caches LLC: 505 commonly shared with the cores 501 to 504. The processor 500 may further include a common cache 506 provided as a near memory.

A cache group may include a plurality of sub-caches 507 to 509. The cache group may be arranged between the processor 500 and the system memories 516 to 519. The sub-caches 507 to 509 may be operated to correspond to the system memories 516 to 519 divided by addresses. For example, the first sub-cache 507 may be used as a memory controller of the first system memory 516 corresponding to a first address section. The second sub-cache 508 may be used as a memory controller for controlling a non-overlapped portion between the second system memory 517 and the third system memory 518 corresponding to a second address section.

The system memories 516 to 519 may include a memory configured to be directly accessed to software activated on the processor 500. In contrast, the caches 501a to 509 may be aided to activations of commands by the cores 501 to 504 under the activation of the software. The system memories 516 to 519 may be manually operated as a part of the processor and/or automatically operated by the software.

The system memories 516 to 519 may include a far memory and a near memory. The far memory and the near memory may include the active region having a diameter of only several nanometers and the dielectric layer on the active region.

The computer system may be interfaced with a dual in-line memory module (DIMM) as a storage device including the semiconductor integrated circuit device. The semiconductor integrated circuit device in the DIMM may include the vertical transistor having the electric field-buffering region.

The DIMM and the computer system may use a dynamic random access memory (DRAM) channel such as a double data rate 3 (DDR3), DDR4, DDR5, etc., as an interface. Reference numerals 600a, 600b and 600c may indicate a cache for an internal processor, a near memory operated as a remote memory cache, and a system memory, respectively.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A method of manufacturing a semiconductor integrated circuit device, the method comprising:
    forming an isolating layer on a semiconductor substrate to define an active region;
    etching the active region to form a groove;

forming a gate insulating layer on an inner surface of the groove;

forming a buried gate in a lower region of the groove;

implanting donors into the active region exposed through the buried gate;

forming a dielectric layer having a high dielectric constant and an insulating property, on an upper surface of the isolating layer, a surface of the active region into which the donors have implanted and an upper surface of the buried gate;

activating the donors in the active region with the dielectric layer covering the active region having the donors, to form a source region and a drain region; and forming an insulating interlayer on the dielectric layer.

2. The method of claim 1, wherein forming of the buried gate comprises:

forming a conductive layer on the semiconductor substrate to fill up the groove; and over-etching the conductive layer to remain the conductive layer in the lower region of the groove.

3. The method of claim 2, further comprising recessing the isolating layer to expose a sidewall of the active region before forming the dielectric layer.

4. The method of claim 2, wherein the dielectric constant of the dielectric layer is higher than a dielectric constant of the insulating interlayer.

5. The method of claim 4, wherein the dielectric constant of the insulating interlayer is about 0.1 to about 5.

6. The method of claim 1, wherein the dielectric layer has a thickness less than a thickness of the insulating interlayer, and wherein a dielectric constant of the dielectric layer is similar to that of the source region or the drain region.

7. The method of claim 1, wherein the insulating interlayer is formed to contact with the dielectric layer formed on the buried gate, the gate insulating layer and the source region and the drain region.

* * * * *